United States Patent
Marx et al.

(10) Patent No.: US 6,866,200 B2
(45) Date of Patent: Mar. 15, 2005

(54) SEMICONDUCTOR DEVICE IDENTIFICATION APPARATUS

(75) Inventors: Eckhard Marx, Radeburg (DE); Martin Peiter, Dresden (DE)

(73) Assignee: Infineon Technologies SG300 GmbH & Co. KG, Dresden (DE)

( * ) Notice: Subject to any disclaimer, the term of this patent is extended or adjusted under 35 U.S.C. 154(b) by 0 days.

(21) Appl. No.: 10/816,142

(22) Filed: Apr. 2, 2004

(65) Prior Publication Data

US 2004/0238636 A1 Dec. 2, 2004

Related U.S. Application Data

(63) Continuation of application No. PCT/EP02/10964, filed on Sep. 30, 2002.

(30) Foreign Application Priority Data

Oct. 8, 2001 (EP) .............................................. 01123998

(51) Int. Cl.[7] .......................... G06K 19/06; G06K 7/00
(52) U.S. Cl. ......................... 235/491; 235/492; 235/454
(58) Field of Search ................................. 235/491, 492, 235/486, 441, 449, 375, 380, 454, 455; 324/758, 754, 760, 757

(56) References Cited

U.S. PATENT DOCUMENTS

| | | | |
|---|---|---|---|
| 3,636,250 A | | 1/1972 | Haeff |
| 4,575,719 A | * | 3/1986 | Bertagna et al. ............. 340/5.9 |
| 4,667,087 A | * | 5/1987 | Quintana .................... 235/380 |
| 4,983,842 A | | 1/1991 | Takamine |
| 5,155,888 A | * | 10/1992 | Lau ........................... 29/25.01 |
| 5,197,650 A | | 3/1993 | Monzen et al. |
| 5,287,414 A | * | 2/1994 | Foster ........................ 382/100 |
| 5,559,446 A | * | 9/1996 | Sano ........................... 324/760 |
| 5,567,927 A | | 10/1996 | Kahn et al. |
| 5,883,374 A | | 3/1999 | Mathews |
| 5,942,763 A | | 8/1999 | Mukogawa |
| 5,982,183 A | * | 11/1999 | Sano ........................... 324/754 |
| 6,075,373 A | * | 6/2000 | Iino ............................ 324/754 |
| 6,168,296 B1 | | 1/2001 | Yoneda |
| 6,215,551 B1 | | 4/2001 | Nikoonahad et al. |
| 6,617,172 B2 | * | 9/2003 | Usami ........................... 438/2 |

FOREIGN PATENT DOCUMENTS

| | | |
|---|---|---|
| EP | 1 073 097 A3 | 7/2001 |
| EP | 0 857 336 B1 | 5/2003 |
| JP | 61236117 A1 | 10/1986 |
| JP | 63108736 A1 | 5/1988 |
| JP | 05-203583 A1 | 8/1993 |
| JP | 06112300 A1 | 4/1994 |
| JP | 10185530 A1 | 7/1998 |
| JP | 10255026 A1 | 9/1998 |
| JP | 11-145017 A1 | 5/1999 |
| WO | WO 91/18313 A1 | 11/1991 |
| WO | WO 01/22028 A1 | 3/2001 |

* cited by examiner

*Primary Examiner*—Thien M Le
(74) *Attorney, Agent, or Firm*—Edell, Shapiro & Finnan, LLC

(57) ABSTRACT

A three-dimensional image of a semiconductor device identification pattern is obtained by measuring the distance of at least one sensor to the surface of the semiconductor device. The apparatus includes a source of radiation for deriving the distance from properties of the reflected light. A unit for determining the distance and an image processing unit are used to establish the three-dimensional picture. Positional information can be achieved in a scanning movement from motors being controlled by a control unit. By applying a threshold value, a two-dimensional image is derived and by a pattern recognition algorithm, the identification pattern can be analyzed.

28 Claims, 4 Drawing Sheets

SEMICONDUCTOR DEVICE IDENTIFICATION APPARATUS

CROSS REFERENCE TO RELATED APPLICATIONS

This application is a continuation of PCT Application No. PCT/EP02/10964, filed on Sep. 30, 2002, and titled "Semiconductor Device Identification Apparatus," which claims priority from Euopean Patent Application No. EP 01123998.5, filed on Oct. 8, 2001, and titled "Semiconductor Device Identification Apparatus," the entire contents of which are hereby incorporated by reference.

FIELD OF THE INVENTION

The present invention relates to a semiconductor device identification apparatus for reading an identification pattern from the surface of a semiconductor device in a processing tool.

BACKGROUND

In semiconductor device manufacturing, in particular, semiconductor wafers, it is often necessary to track single devices or lots through their sequence of processing steps. For this reason, each device is marked with a device identification number comprising, e.g., the lot name and the device number. In case of entering a processing tool, the device identification supplied on the device surface is read out in order to check, whether the correct device is currently being processed, and perhaps information is retrieved from a database, whether specific actions are to be taken for the current device.

In the case of semiconductor wafers as an example, single wafer tracking is enabled by engraving the wafer identification onto the wafer backside surface in, e.g., the form of a dot matrix by use of a laser. A laser spot engraves a hole at a specified position in the matrix on the device surface, e.g. representing a binary "one". If a matrix element position is free of an engraved laser dot, a binary "zero" is provided, then. Thus, the binary dot matrix can be read out and be interpreted in terms of an identification number.

Alternatively, the matrix of dots directly corresponds to a structure providing a number or character when being recognized. Commonly, the device identification number is first read out by use of a CCD-camera, and second, identified by using a pattern recognition algorithm in an image processing unit.

In the same way, it is also possible to structure elevations on the device surface, e.g., with the help of a laser depositing some material at predefined matrix positions. The read-out process and the recognition is then performed in the same way as described above.

The approach using a CCD-camera has several disadvantages under productive circumstances. For example, the read-out rate of the engraved dot matrix can be too low originating from discoloration of the surface leading to ring-like structures on the surface layer of the semiconductor wafer. Such a ring running through a laser dot or hole can result in a non-detection of the corresponding matrix element, thereby issuing an error signal if the corresponding wrong wafer identification is currently not expected at the processing tool.

Moreover, dust particles due to previous processing may have deposited inside the engraved holes, thereby additionally decreasing the color contrast, which is necessary for the optical CCD-camera approach. Also, deposited oxide layers lead to a reduction of the depth of the holes obliterating the sidewall contrast for the CCD-camera. In such cases, only concave surfaces indicate the existence of underlying laser-engraved holes.

In order to circumvent these disadvantages, an apparatus using a laser emitting coherent light onto the laser dots or holes and a detector array receiving the light that is scattered at the concave sidewalls of laser holes being covered with an oxide layer is provided in DE 197 52 663 A1. There, a laser hole, or pattern, is recognized by an enhanced contrast due to the surface having plain, concave, or convex structure, thereby concentrating or diluting, respectively, the light scattered onto the array. Due to the enhanced contrast, a contrast-rich surface map of the wafer can be established by scanning the surface portion under investigation. The map of scattered light can then be evaluated into a potential map of the surface. Using an image processing unit with a pattern recognition algorithm, the wafer identification can then be performed.

Unfortunately, this approach becomes particularly advantageous only in the case of the laser holes being obliterated by deposition of an oxide layer. If alternatively the laser inscription itself is not deteriorated, but rings of discoloration only impose changes of surface characteristics, the scattering approach becomes inefficient. Moreover, efforts have to be spent in order to calculate the potentials of the laser dots, and in case of dense matrices, it is questionable whether a unique potential solution can be expected. In the case of steep sidewalls of the laser holes, the contrast even reduces due to the lack of convex or concave surface elements.

SUMMARY

A semiconductor device identification apparatus can reduce erroneous reading of device identification patterns due to discolorations, while providing a high image pattern contrast for a large range of dot profiles. In particular, a semiconductor device identification apparatus for reading an identification pattern from the surface of a semiconductor device, in which identification pattern includes a matrix of holes or elevations formed in said surface, can include a source of radiation for irradiating the holes or elevations, a sensor for detecting the radiation being reflected from the surface and the holes or elevations, a means for determining the distance of the sensor to the semiconductor device surface, at least one motor for moving the sensor in at least one distance level above the surface, and a control unit for controlling the movement due to the at least one motor.

The present invention can derive three-dimensional information of the device identification pattern area. For this purpose, for example, a measurer or a means for determining the distance of the sensor to the semiconductor device surface, or the holes or elevations respectively, can be provided. The distance measurements can be performed either by individually scanning the surface for retrieving local height levels of the surface, or the holes or elevations, or by performing multi-directional distance measurements from a predefined set of sensor positions. The first apparatus is more appropriate for sources of radiation working with light, while the latter aspect is convenient for acoustic radiation.

Having obtained a distance map of the identification pattern surface, a three-dimensional surface map can be calculated, if the three-dimensional positions of the measuring sensor are known. The corresponding information can be provided by the control unit that controls the movement of the sensor performed by the motor, and the sensor, which provides distance raw data, which can be evaluated to real distance data. In case of a non-vertical direction of light being received by the sensor, directional information can also be needed. In this case, the control unit can maintain the movement of the direction of the optical path leading to the sensor.

The present invention can work irrespective of colors. Thus, the problem of discolorations due to previous processes leading to erroneous wafer identification reading can be circumvented. The wavelength of the light used is not important for the present invention to work accurately. Although monochromatic light is preferred, multi-frequency radiation is generally possible.

Also, the obliteration of the laser holes with dust or oxide layers on the one side or no contaminating particles on the other side do not put restrictions to the present invention. The present invention does not depend on the exact form of the surface profile. Only the distances are measured, and as long as height differences are immanent in significant amounts, the corresponding distance differences can be measured and the holes can be detected. Therefore, the present invention can offer a high variability and is not restricted to specific laser hole sidewall geometric forms. Rectangular steps as well as smooth concave or convex transitions can be detected by their distance to the sensor.

In a further aspect, the radiation is considered to be a concentrated beam of light and the corresponding spot diameter is considered to be smaller than the diameter of the structure to be measured, i.e., the hole or elevation. In an exemplary configuration, the source of radiation is a laser. Using then a spot of this size, the profile of the laser hole can be scanned by subsequent measurements of the distance to the sensor, which, for example, can be moved across the surface in a horizontal direction. In a further aspect, the sensor can be considered to be a position-sensitive device (PSD), which can receive light through an optical system by a beam splitter. Such configurations for arbitrary distance measurements are commonly available and offer sufficient precision for performing distance measurements of pattern sizes provided for the present apparatus.

In a further aspect, the image processing unit can include a pattern recognition means for identifying the identification pattern. There are two approaches possible: first, expected three-dimensional patterns, i.e., laser hole forms, as reference patterns can be compared with structures in the three-dimensional image, or second, the three-dimensional image can be reduced to a two-dimensional image by applying a threshold height value. Any height value above this threshold can be associated with a binary "one", and those values below this threshold can be associated with a binary "zero". The laser engravement procedure can structure into a two-dimensional pattern onto the surface.

In a further aspect, the identification pattern can be considered to be a barcode using such a identification pattern, adjacent laser holes can be connected or at least provide a common structure, if taken together. The pattern recognition software can have a restricted number of structures possible in the dot matrix. The bars have the same length (with a few exceptions, for example, at the border) and a distinct choice of widths can be provided.

As mentioned before, a further approach can use of acoustic waves for the radiation. Due to the limited velocity of these waves, run time differences can be measured due to which a distance measurement is possible. A three-dimensional profile of the identification pattern surface can be gained by locally emitting and receiving acoustic waves and the run time difference can provide the nearest distance of a surface element. This approach can use minimum size emitters and sensors.

Another approach is to emit acoustic waves at three different positions above the identification pattern surface, and then recording the signal of reflected waves as a function of time. Recovering the surface profile from these reflected signals as a function of time involves some effort in computation, but which are well-known in the art.

A method of identifying a semiconductor device using the apparatus of the present invention can include moving the source of radiation and the sensor to a first position above an identification pattern matrix of holes or elevations, irradiating a beam of radiation onto a first spot on the surface using the source of radiation, detecting the radiation which is reflected from the spot on the surface using the sensor, determining the first distance of the surface spot to the sensor using the means for determining the distance (measurer), repeating the steps described above for determining further distances of further surface spots to said sensor position, generating a three-dimensional image of surface heights from the distances as a function of position, and using a pattern recognition algorithm to identify said identification pattern matrix of holes or elevations.

By this method, the surface can be scanned by distance measurements resulting in a three-dimensional image of surface height as a function of position, which can be input to an image processing unit for being applied to a pattern recognition algorithm for identifying the identification pattern of the semiconductor device.

BRIEF DESCRIPTION OF THE DRAWINGS

The invention will be better understood by reference to the following description of embodiments of the invention taken in conjunction with the accompanying drawings, wherein.

DETAILED DESCRIPTION

Figure 1:
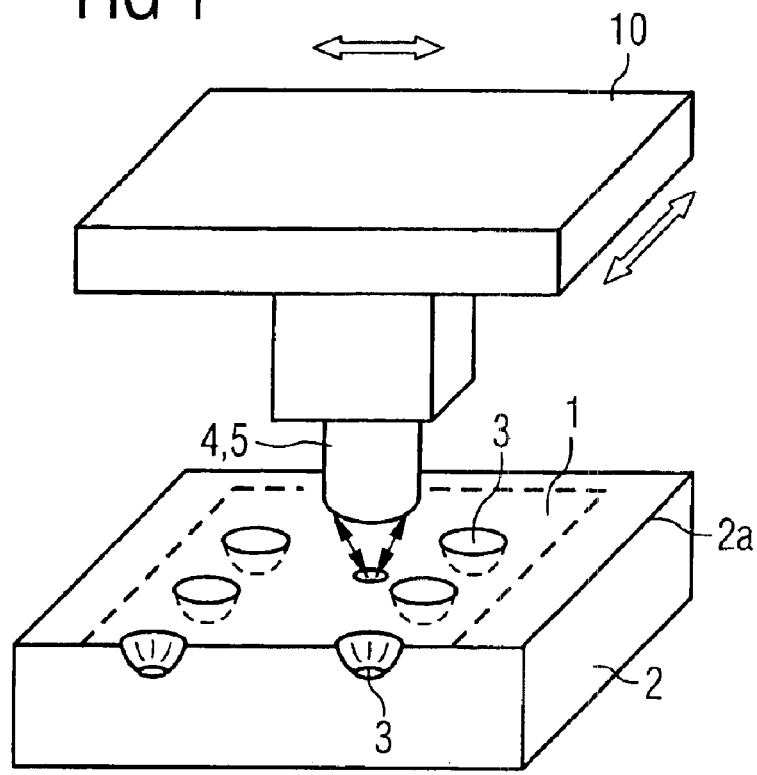
FIG. 1 shows a stage with the sensor and radiation source scanning a semiconductor device having an identification pattern with laser dot holes.

The source of radiation 4, which can be a laser, and a sensor 5 can be mounted on a stage 10, as shown in FIG. 1. The stage 10 can provide a scanning movement in both x- and y-direction at a constant height level above a semiconductor device 2 having a surface 2a, on which an identification pattern 1 is structured by an arrangement of laser-engraved holes 3. The semiconductor device 2, according to this embodiment, can be a semiconductor wafer and the surface 2a can be the wafer backside surface, and the identification pattern 1 is to be read out for performing an identification in, e.g., a sorter or another semiconductor processing tool.

Figure 2:
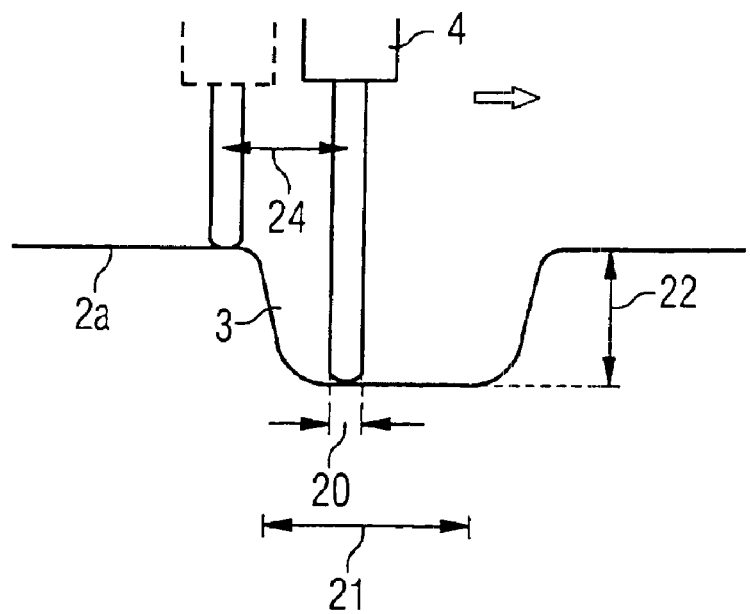
FIG. 2 shows a side view of a laser dot hole, which is scanned with a laser and a sensor.

A side view of the scanning procedure is shown in FIG. 2. For illustrating the distance measurement, a cut is performed through the position of a hole 3 being engraved into the surface 2a. Two scanning steps having a scanning pitch 24, e.g., the horizontal distance between two laser beams, can be visualized in FIG. 2. The source of radiation, i.e., the laser according to this embodiment, can concentrate its laser beam in a vertical direction directly onto the surface 2a or hole 3, respectively, below the laser 4. In order to scan the hole profile, the laser spot diameter 20 can have a width of 10 nm, which is considerably smaller than the laser-engraved hole diameter 21 of 100 $\mu$m.

Figure 3:
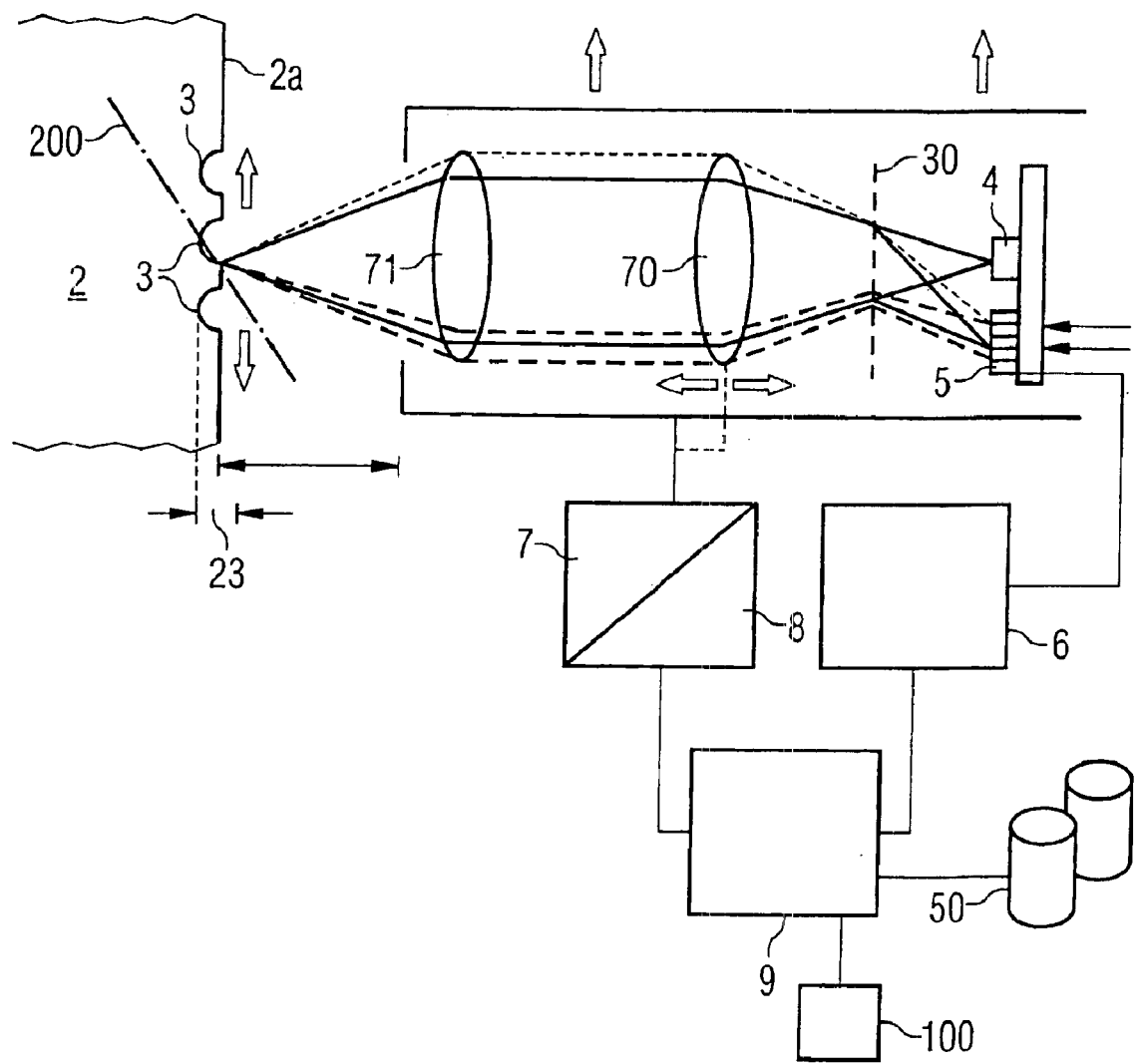
FIG. 3 shows an embodiment of the apparatus using a position-sensitive device.

In FIG. 3, the apparatus according to an embodiment of the present invention is shown in detail. A system of optical lenses 70, 71 can focus light emitted at a wavelength of 780 nm from a laser diode 4 onto a laser spot at the surface 2a of a semiconductor wafer 2 being provided with holes 3 of an identification pattern 1. The light can be emitted back through the optical lenses 70, 71 onto a beam splitter 30 diffracting the beam onto a spot residing on a position-sensitive device 5.

The position-sensitive device 5 can be connected to a measurer or means for determining the distance 6 of the surface 2a to the sensor 5. There are at least two possibilities, or embodiments, how the apparatus works measuring the distance:

1.) A distance can be measured by an auto-focus measurement. If the laser spot on the surface 2a runs out of focus due to a hole 3 or an elevation, the spot reflected through the optical lenses 70, 71 and the beam splitter 30 onto the position-sensitive device 5 can become blurred or widened, and the corresponding widening shift of the spot, or the intensity or gradient, can be measured across the position-sensitive device (PSD-) array 5. The measurer or means for determining the distance 6 can be a processing unit receiving these array data, which can calculate the gradient or changed local intensity across the array into a defocus value, i.e., the amount of deviation current focus position from the corresponding surface position as being pointed to by the beam. A corresponding signal can be sent to the control unit 8, which can provide a movement of either one of the optical lenses 70 for establishing an optimum focus by the motor 7, or can change the distance of the complete system, i.e., the optical lenses 70, 71, the beam splitter 30 and the position-sensitive device 5 from the surface 2a. In a vertical movement (horizontal in FIG. 3), the measurer or means for determining the distance 6 can determine the distance from the knowledge of the amount of defocus.

2.) Due to a surface inclination 200 when entering a hole 3 on the surface 2a, the reflected beam can be shifted, which can lead to a shift of the spot on the position-sensitive device 5 (PSD). The corresponding shift in the array can then be detected by the measurer or means for determining the distance 6 and can be converted into a distance value.

Using one of the two approaches, the measurer or means for determining the distance 6 can forward the distance data to the image processing unit 9 and the control unit 8 moving the optical system can forward positional data to the image processing unit 9 as well. The positional information and the distance information can be combined into a three-dimensional image of the surface structure 2a in the identification pattern area. For each x- and y-coordinate, the distance value can be converted into a height value of the local surface area covered by the laser spot. If the distance of the position-sensitive device 5 from the surface 2a is constant throughout the distance measurements, this procedure can be straightforward. If the distance has changed, particularly, in the case of an autofocus measurement, where the optical path length is held constant instead of the metric distance, the vertical height corrections by motor 7 or either the optical lens 70 or the complete optical system 70, 71, 30, 4, 5 are to be summed up by control unit 8 or the measurer or means for determining the distance 6. The same is valid in the case of measuring the inclination if the optical system follows the surface profile by vertical height corrections. Here, the height changes are also to be summed up for adjacent measurements.

The image processing unit 9 can store the images in a database 50 and eventually can use a pattern recognition means or device 100 according to the method of the present invention for recovering a two-dimensional pattern of the wafer backside surface in order to identify the wafer.

The system can have a measuring range in vertical height direction 23 of +/–150 $\mu$m as compared to a depth 22 of holes 3, which amounts to 100 $\mu$m if no dust or oxide layers are deposited inside holes 3.

Figure 4:
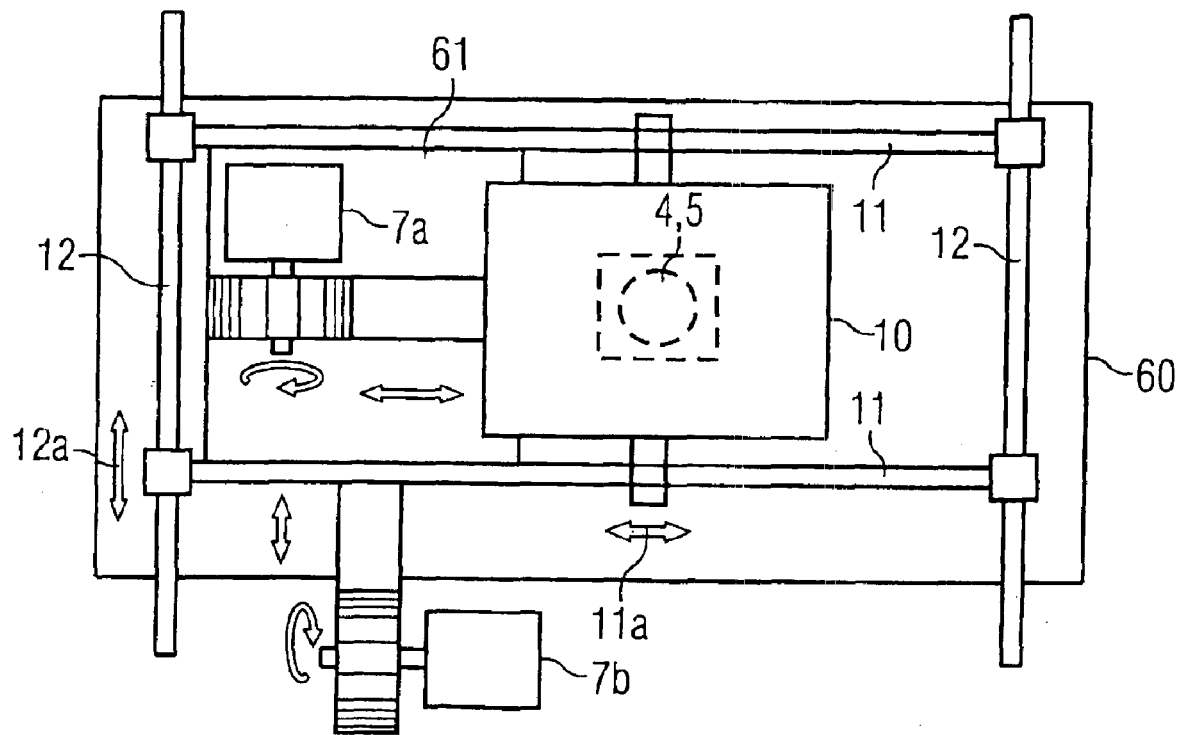
FIG. 4 shows a top view of the stage being mounted on guide rails driven by motors.

The technique of moving the stage 10 across the identification pattern 1 on surface 2a is illustrated in FIG. 4. The apparatus can include guide rails 11, 12, which are each driven by motors 7a, 7b. The guide rails 12 can be mounted on a frame 60 shown in the top view of FIG. 4. Guide rails 11 can be mounted on these guide rails 11 fully disposable by motor 7b, which can move the guide rails 11 along guide rails 11 by a metal band structured similarly as in floppy disk drives. Guide rails 11 can be mounted on a motor stage 61 holding the second motor 7a, which can have a similar structure as motor 7b with metal bands, which by being unrolled provide a movement of the stage 10, to which the metal band can be connected.

Stage 10 can also be mounted being freely disposable on guide rails 11, thus providing a horizontal adjustment in a second direction 11a, additionally to the first direction 12a provided by the movement of the motor stage 61 along guide rails 12.

Figure 5:
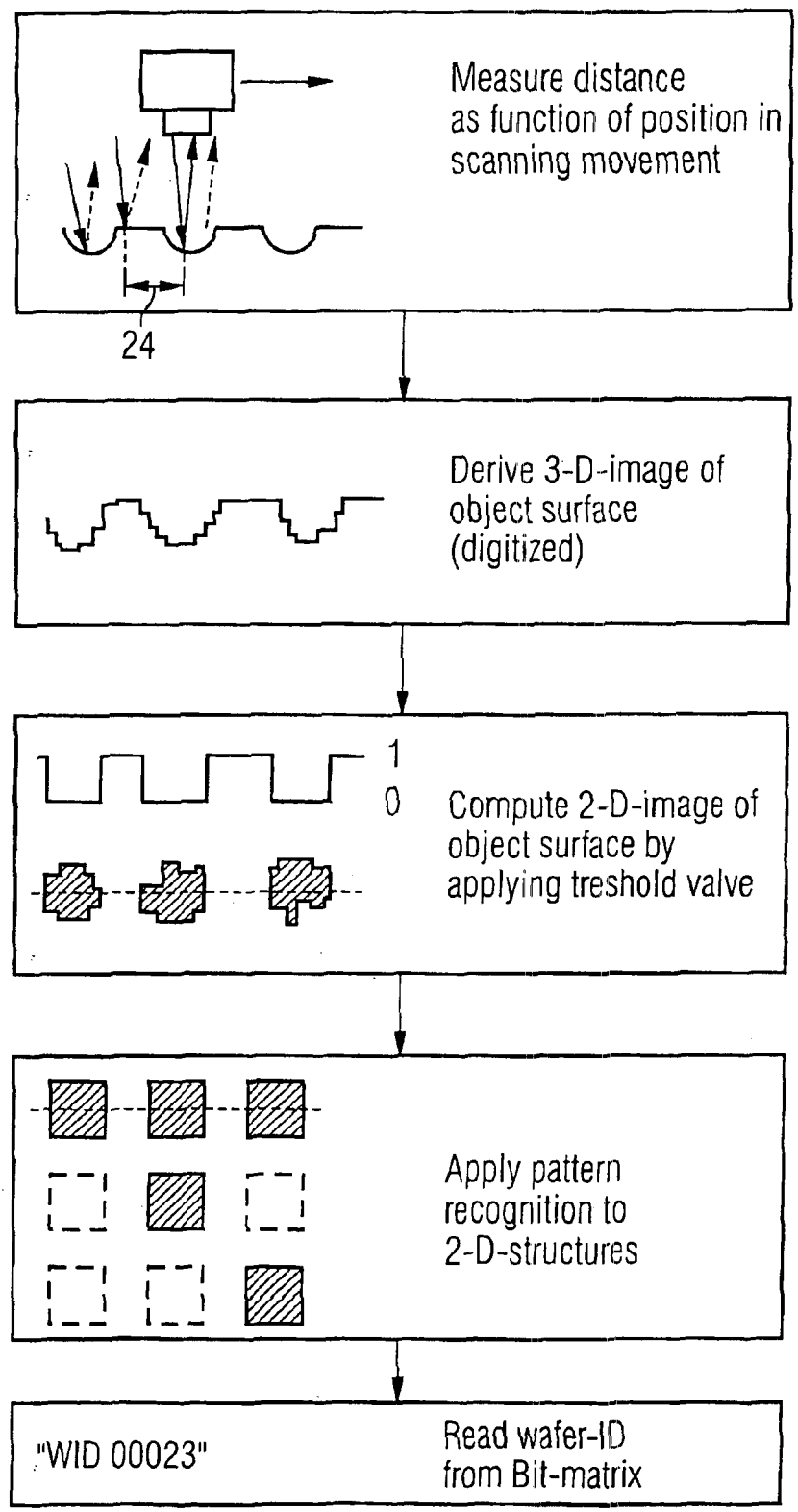
FIG. 5 shows a flowchart performed by the method of the present invention.

The method according to the present invention is illustrated in FIG. 5. After providing the semiconductor wafer 2 to the apparatus and aligning it, such that the identification pattern 1 can take a defined position in front of the frame 60 with the sensor and source of radiation having a default position, the apparatus can start scanning the surface 2a including holes 3 of the identification pattern 1 at a scan rate of 30 kHz. The identification pattern 1 can include an area of 3.2 mm×1.6 mm, such that the pitch or step width 24 amounts to 50 $\mu$m. Using the frame 60 of the present apparatus, its central opening area can be, for example, 5 mm×2 mm.

Using the apparatus according to the present invention, a digitalized three-dimensional image can be obtained by the measurer or means for determining the distance 6 for obtaining height values, the control unit 8 for obtaining positional data, and the image processing unit 9 can combine these data. Applying a threshold level to the height values, a binary one can be associated with the positional address values having a height value above this threshold level, and a binary zero with height values below this level. Thereby, the three-dimensional image can be reduced to a two-dimensional image including areas associated with the one and with the zero value. The threshold value may be iteratively adjusted together with the following pattern recognition algorithm in order to obtain legible structures.

If the pattern recognition algorithm only expects binary-"one"-squares as reference patterns, these will eventually be recovered from the reduced two-dimensional image, and the corresponding matrix filling can be evaluated to provide the wafer identification number.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCES NUMERALS 1 identification pattern
2 semiconductor device, wafer
2a device surface, wafer surface
3 laser dot holes of identification pattern
4 source of radiation, laser
5 sensor, position-sensitive device
6 means for determining the distance
7 motor
7a motor, x-direction
7b motor, y-direction
8 control unit for motor
9 image processing unit
10 stage carrying sensor and source of radiation
11 guide rail, x-direction
11a x-direction
12 guide rail in y-direction
12a y-direction
20 laser spot diameter
21 hole diameter
22 hole depth
23 focus range, measuring range
24 pitch, step width
30 beam splitter
50 database
60 frame
61 motor stage
70 optical lens, movable for autofocus
71 optical lens
100 pattern recognition algorithm
200 inclination

We claim:

1. A semiconductor device identification apparatus for reading an identification pattern from the surface of a semiconductor device, the identification pattern including a matrix of holes or elevations formed in the surface, comprising:
    a source of radiation for irradiating the holes or elevations;
    a sensor for detecting the radiation being reflected from the surface and the holes or elevations;
    a means for determining the distance of the sensor to the semiconductor device surface;
    at least one motor for moving the sensor in at least one distance level above the surface;
    a control unit for controlling the movement due to the at least one motor; and
    an image processing unit, the image processing unit being designed to generate a three-dimensional image of the surface with the matrix of the holes or elevations, the image processing unit being connected to
        a) the means for determining the distance for acquiring distance data, and
        b) the control unit for acquiring positional data of the sensor.

2. The apparatus according to claim 1, wherein the radiation has a spot diameter of less than the diameter of the holes or elevations.

3. The apparatus according to claim 2, wherein the source of radiation is a laser.

4. The apparatus according to claim 1, wherein the sensor is a position sensitive device receiving reflected light by a beam divider.

5. The apparatus according to claim 1, wherein the image processing unit includes a pattern recognition means for identifying the identification pattern.

6. The apparatus according to claim 1, wherein the matrix of holes or elevations represents a bar code on the semiconductor device.

7. The apparatus according to claim 2, wherein the laser spot diameter ranges from 4 $\mu$m to 20 $\mu$m, the vertical measurement range of the laser is 300 $\mu$m, the vertical height of at least one of the holes or elevations is more than 80 $\mu$m, the diameter of at least one of the holes or elevations (is more than 80 $\mu$m.

8. The apparatus according to claim 1, further comprising:
    a stage carrying the sensor;
    at least one first guide rail, at which the stage is mounted being freely disposable in a first direction;
    at least one second guide rail, at which the first at least one guide rail is mounted being freely disposable in a second direction;
    a first motor for providing a movement of the stage with the sensor along the first direction of the at least one first guide rail; and
    a second motor for providing a movement of the stage with the sensor along the second direction of the at least one second guide rail.

9. The apparatus according to claim 1, wherein the source of radiation emits acoustic high-frequency waves.

10. A method of identifying a semiconductor device, comprising:
    a) moving the source of radiation and the sensor to a first position above a identification pattern matrix of holes or elevations;
    b) irradiating a beam of radiation onto a first spot on the surface using the source of radiation;
    c) detecting the radiation, which is reflected from the spot on the surface using the sensor;
    d) determining the first distance of the surface spot to the sensor using a means for determining the distance;
    e) repeating steps a), b), c) and d) for determining at least a second distance of at least a second surface spot to the sensor having at least a second position;
    f) generating a three-dimensional image of surface height from the at least first and second distance as a function of the at least first and second position; and
    g) using a pattern recognition algorithm to identify the identification pattern matrix of holes or elevations.

11. The method according to claim 10, further comprising:
    applying a threshold value to the three-dimensional image before using the pattern recognition algorithm for associating a binary value with each of the at least two positions on the surface.

12. The method according to claim 10, further comprising scanning a portion of the semiconductor device surface including the identification pattern with the source of radiation and the sensor for obtaining a three-dimensional image of the surface portion, the spots having a pitch between 20 $\mu$m and 50 $\mu$m.

13. The method according to claim 12, wherein the rate of scanning the portion with adjacent spots is more than 20 khz and less than 40 khz.

14. The apparatus according to claim 1, wherein the image processing unit includes a pattern recognition device for identifying the identification pattern.

15. A semiconductor device identification apparatus for reading an identification pattern from the surface of a semiconductor device, the identification pattern including a matrix of holes or elevations formed in the surface, comprising:
- a source of radiation for irradiating the holes or elevations;
- a sensor for detecting the radiation being reflected from the surface and the holes or elevations;
- a measurer for determining the distance of the sensor to the semiconductor device surface;
- at least one motor for moving the sensor in at least one distance level above the surface;
- a control unit for controlling the movement due to the at least one motor; and
- an image processing unit, the image processing unit being designed to generate a three-dimensional image of the surface with the matrix of the holes or elevations, the image processing unit being connected to
  - a) the measurer for determining the distance for acquiring distance data, and
  - b) the control unit for acquiring positional data of the sensor.

16. The apparatus according to claim 15, wherein the radiation has a spot diameter of less than the diameter of the holes or elevations.

17. The apparatus according to claim 16, wherein the source of radiation is a laser.

18. The apparatus according to claim 15, wherein the sensor is a position sensitive device receiving reflected light by a beam divider.

19. The apparatus according to claim 15, wherein the image processing unit includes a pattern recognition means for identifying the identification pattern.

20. The apparatus according to claim 19, wherein the image processing unit includes a pattern recognition device for identifying the identification pattern.

21. The apparatus according to claim 15, wherein the matrix of holes or elevations represents a bar code on the semiconductor device.

22. The apparatus according to claim 16, wherein the laser spot diameter ranges from 4 $\mu$m to 20 $\mu$m, the vertical measurement range of the laser is 300 $\mu$m, the vertical height of at least one of the holes or elevations is more than 80 $\mu$m, the diameter of at least one of the holes or elevations (is more than 80 $\mu$m.

23. The apparatus according to claim 15, further comprising:
- a stage carrying the sensor;
- at least one first guide rail, at which the stage is mounted being freely disposable in a first direction;
- at least one second guide rail, at which the first at least one guide rail is mounted being freely disposable in a second direction;
- a first motor for providing a movement of the stage with the sensor along the first direction of the at least one first guide rail; and
- a second motor for providing a movement of the stage with the sensor along the second direction of the at least one second guide rail.

24. The apparatus according to claim 15, wherein the source of radiation emits acoustic high-frequency waves.

25. A method of identifying a semiconductor device, comprising:
- b) moving the source of radiation and the sensor to a first position above a identification pattern matrix of holes or elevations;
- b) irradiating a beam of radiation onto a first spot on the surface using the source of radiation;
- c) detecting the radiation, which is reflected from the spot on the surface using the sensor;
- d) determining the first distance of the surface spot to the sensor using a measurer for determining the distance;
- e) repeating steps a), b), c) and d) for determining at least a second distance of at least a second surface spot to the sensor having at least a second position;
- f) generating a three-dimensional image of surface height from the at least first and second distance as a function of the at least first and second position; and
- g) using a pattern recognition algorithm to identify the identification pattern matrix of holes or elevations.

26. The method according to claim 25, further comprising:
applying a threshold value to the three-dimensional image before using the pattern recognition algorithm for associating a binary value with each of the at least two positions on the surface.

27. The method according to claim 25, further comprising scanning a portion of the semiconductor device surface including the identification pattern with the source of radiation and the sensor for obtaining a three-dimensional image of the surface portion, the spots having a pitch between 20 $\mu$m and 50 $\mu$m.

28. The method according to claim 27, wherein the rate of scanning the portion with adjacent spots is more than 20 khz and less than 40 khz.

* * * * *

UNITED STATES PATENT AND TRADEMARK OFFICE
CERTIFICATE OF CORRECTION

PATENT NO. : 6,866,200 B2
DATED : March 15, 2005
INVENTOR(S) : Marx et al.

It is certified that error appears in the above-identified patent and that said Letters Patent is hereby corrected as shown below:

<u>Title page,</u>
Item [73], Assignee, should read -- [73], Assignee: -- Infineon Technologies SC300 GmbH & Co. KG --

Signed and Sealed this

Twenty-eighth Day of June, 2005

JON W. DUDAS
*Director of the United States Patent and Trademark Office*